(12) United States Patent
Wu et al.

(10) Patent No.: US 7,943,052 B2
(45) Date of Patent: May 17, 2011

(54) METHOD FOR SELF-ASSEMBLING MICROSTRUCTURES

(75) Inventors: Enboa Wu, Taipei (TW); Chia-Shou Chang, Taipei (TW)

(73) Assignee: National Taiwan University, Taipei (TW)

(*) Notice: Subject to any disclaimer, the term of this patent is extended or adjusted under 35 U.S.C. 154(b) by 866 days.

(21) Appl. No.: 11/866,273

(22) Filed: Oct. 2, 2007

(65) Prior Publication Data

US 2008/0023435 A1    Jan. 31, 2008

Related U.S. Application Data

(63) Continuation-in-part of application No. 11/172,960, filed on Jul. 5, 2005, now abandoned.

(51) Int. Cl.
*H01B 13/00* (2006.01)

(52) U.S. Cl. ............ 216/20; 216/37; 216/41; 427/184; 427/255.14; 427/319

(58) Field of Classification Search .......... 216/20, 216/37, 41; 427/184, 319, 255.14
See application file for complete search history.

(56) References Cited

U.S. PATENT DOCUMENTS

| | | | |
|---|---|---|---|
| 5,249,733 A | 10/1993 | Brady et al. | |
| 5,355,577 A * | 10/1994 | Cohn | 29/592.1 |
| 5,545,291 A | 8/1996 | Smith et al. | |
| 5,824,186 A | 10/1998 | Smith et al. | |
| 6,265,085 B1 | 7/2001 | Watanabe et al. | |
| 6,527,964 B1 | 3/2003 | Smith et al. | |
| 6,623,579 B1 | 9/2003 | Smith et al. | |
| 6,780,696 B1 | 8/2004 | Schatz | |

OTHER PUBLICATIONS

Heiko Jacobs et al. Science, vol. 296, (2002), pp. 323-325.*
Science: vol. 296, No. 5566, pp. 323-325 Apr. 12, 2002.

* cited by examiner

*Primary Examiner* — Nadine G Norton
*Assistant Examiner* — Maki A Angadi
(74) *Attorney, Agent, or Firm* — Birch, Stewart, Kolasch & Birch, LLP

(57) ABSTRACT

A method for self-assembling a plurality of microstructures onto a substrate comprising using a bonding material to make the microstructure assembled onto the substrate by a physical attraction force. The microstructures are self-aligned with the substrate, and further permanently fixed on and electrical connection with the substrate by the solder bumps between the microstructures and the substrate, which is formed by the solder bumps via reflow process. There is no need for the using of the conventional pick-and-place device in the present method. The present method could be applied to light emitting diodes, RFID tags, micro-integrated circuits or other types of microstructures.

28 Claims, 11 Drawing Sheets

METHOD FOR SELF-ASSEMBLING MICROSTRUCTURES

This application is a Continuation-In-Part of application Ser. No. 11/172,960 filed on Jul. 5, 2005, now abandoned the entire contents of which are hereby incorporated by reference and for which priority is claimed under 35 U.S.C. §120.

BACKGROUND OF THE INVENTION

1. Field of the Invention

The present invention relates to a method for producing of electronic integrated circuit, and more particularly to a method for self-assembling chips onto a substrate.

2. Description of Related Art

In general, an integrated circuit is composed of multiple electronic components on a single substrate so that the integrated circuit is high density and multi-functional. However, as the need for minimization and multi-function of electronic products, the quantity of electronic components on the integrated circuit relatively increases and the size of the electronic components is required to be smaller.

Take a light emitting diode (LED), which is a component made by semiconductor material, as an example. In general, the LED is a miniature, solid type light-emitting source and is able to transform electrical energy into light. Because of its features of long life time, good shock-proof ability, low drive voltage and mercury free, the LED could meet the needs of being light, thin, short and small for electronic industry nowadays. The LED is popular in various fields of daily life, e.g. car lamps, indicators, traffic signals and all kinds of consumer's products. Besides, since the popularization of LED and the features thereof, it is regarded as the new lighting device of 21st century recently.

The conventional LED could be divided into a lamp type and a surface mount type according to its type of packaging. Either type requires a pick-and-place device to move these chips onto a substrate or a metal bracket for packaging. However, when the size of the chip is smaller than 1 mm, the pick-and-place device is not going to fulfill the designed goal, even though these chips are attached by flip-chip method. Vacuum, static or airflow etc. is introduced to hold the chip smaller than 1 mm, but because these chips are so small that the pick-and-place processing is too time consuming and cost ineffective. Besides, the used equipment of above mentioned pick-and-place technique is very expensive, so it increases the difficulty and cost.

U.S. Pat. No. 5,355,577 disclosed a method using electrostatic force and shape complementary to self-assemble microstructures. However, the high voltage required during the process to provide sufficient electrical field increases safety concerns and cost of manufacture so it is difficult to be used.

Heiko O. Jacobs et. al. (Science, 296(12), 323-325 (2002)) disclosed a method to self-assemble a large quantity of microstructures onto a substrate of curved surface. The method applies the low-melting point solder which has a melting point around 50° C. to allow the microstructures to self-assemble and further remove the erroneous assembly by a disturbance to correct the assembly. However, the low melting point solder used by Jacobs et. al. is a unique material and difficult to obtain, which largely limits the practical application of the method.

U.S. Pat. No. 5,824,186 disclosed a different self-assembly method of microstructures. With reference to FIG. 1, according to the self-assembly method of microstructures disclosed by the patent a microstructure 100 of a predetermined shape is disturbed so as to move close to a substrate 102, which results in that the microstructure 100 is imbedded in a recess 104 which is predetermined in a surface of the substrate 102. It means that the recess 104 has the shape complementary to the microstructure 100. Moreover, alloy layer 106 with the low-melting point is formed on the interface of the microstructure 100 and the recess 104 to further allow the microstructure 100 to be adhered and positioned in the recesses 104 on the substrate 102. However, due to the limitations of having the recess 104 on the substrate 102 and having a shape complementary of each recess 104 to the microstructure 100, hence it increases the manufacture cost.

The self-assembling process includes the release of the microstructures and self assembling. After the release, the microstructures were randomly suspended in the liquid. The self assembling can occur because the shape of the microstructures is complementary to that of each recess or the property of the microstructures is different from that of the recess. However, the multi-bonding in the self assembling process is usually not so accurately because the microstructures fell in different directions, and if the shape or the properties cannot be matched, the self assembling cannot be achieved.

U.S. Pat. No. 5,545,291 disclosed a method for assembling microstructures onto a substrate through fluid transport. With reference to FIG. 11, silicon substrate 50 comprises etched recessed regions 55. A variety of techniques including wet etching, plasma etching, reactive ion etching, ion milling, among others provide recessed regions 50, or generally trenches, receptors, or binding sites. Such techniques etch recessed regions 50 with a geometric profile which is complementary to GaAs block 19. In the silicon substrate, for example, each recessed region includes a trapezoidal profile or inverted truncated pyramid shape. The trapezoidal profile allows GaAs block 19 to self-align and fit closely into recessed region 50 via the fluid transferring technique. Because the GaAs blocks 19 are randomly distributed in the liquid, the amount of the recessed regions 55 should be several times of that of the GaAs blocks 19 for good self assembling.

U.S. Pat. Nos. 6,527,964 and 6,623,579 disclosed a method and an apparatus for fluidic self assembly by disturbing and controlling the fluid flow. Furthermore, U.S. Pat. No. 6,780,696 disclosed a method and an apparatus for self-assembly of functional blocks on a substrate facilitated by electrode pairs.

However, in the prior art mentioned above, a large amount of the chips randomly distributed in the fluid was required, and the self assembling or the electric field attraction is required to be repeated for many times. Therefore, the steps of the self assembling process are increased, and thereby the manufacturing cost is increased and the design becomes more difficult.

Other objects, advantages and novel features of the invention will become more obvious from the following detailed description when taken in conjunction with the accompanying drawings.

SUMMARY OF THE INVENTION

The primary objective of the present invention is to provide a method for self-assembling micrometer or sub-micrometer electronic or mechanical components onto a substrate so as to position accurately onto a substrate in a predetermined pattern.

In another aspect of the present invention, an improved and easier operational process is provided to allow the micrometer or sub-micrometer electronic or mechanical components to be self-assembled onto the substrate so as to save manufacture time and reduce manufacture cost effectively.

In order to accomplish the objectives of the present invention, a bonding material is provided to the substrate and the components such that a physical attraction between the bonding material is able to self-align and position these components on the substrate. Then solder bumps are formed on each of the components by reflowing such that the microstructures are able to self-align on the substrate and permanently fixed on the substrate. The method is able to be applied to microstructures of the electronic components, photoelectric components or magnetic components, ex, light emitting diodes, RFID tags, micro-integrated circuits and so on.

The method allows multiple micrometer or sub-micrometer components to be quickly assembled on predetermined positions on the substrate via a physical attraction between the components and a substrate.

In a different aspect of the present invention, solder is employed as a bonding agent for the microstructures to be fixed onto the substrate in the final step so that the method is able to be combined with the flip chip method. Further, the method may also be applied to any curved plane so as to increase the application scope thereof.

From a different aspect of the present invention, it is noted that the method employing self-assembling and reflowing solder to replace the conventional pick-and-place device such that the manufacture cost and time are saved.

Other objects, advantages and novel features of the invention will become more apparent from the following detailed description when taken in conjunction with the accompanying drawings.

DETAILED DESCRIPTION OF PREFERRED EMBODIMENT

Figure 1:
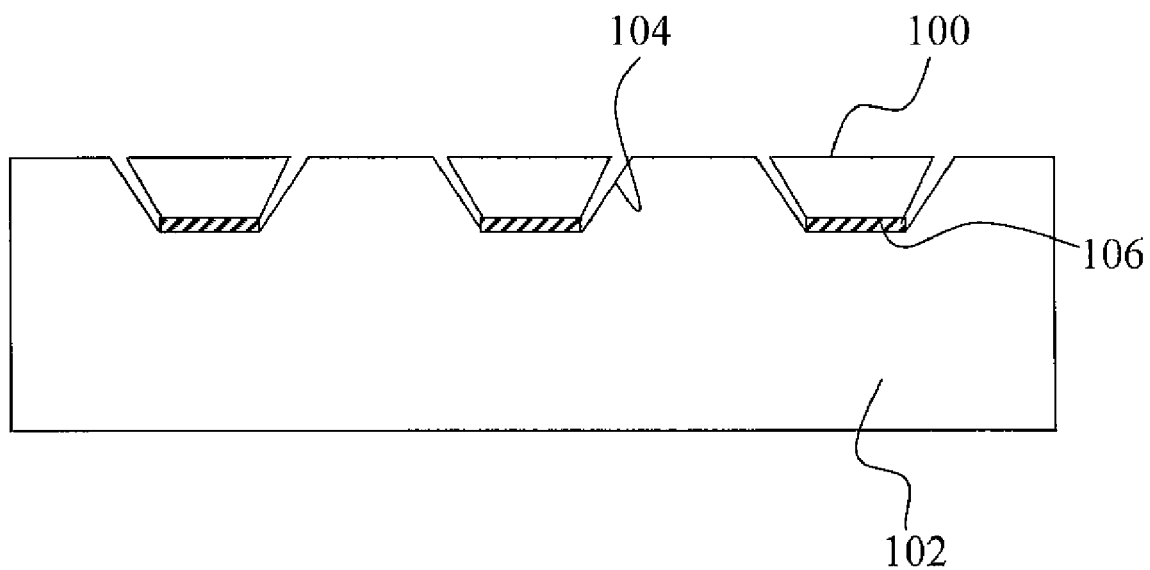
FIG. 1 is a schematic view showing the microstructures assembly of a conventional method.
Figure 2:
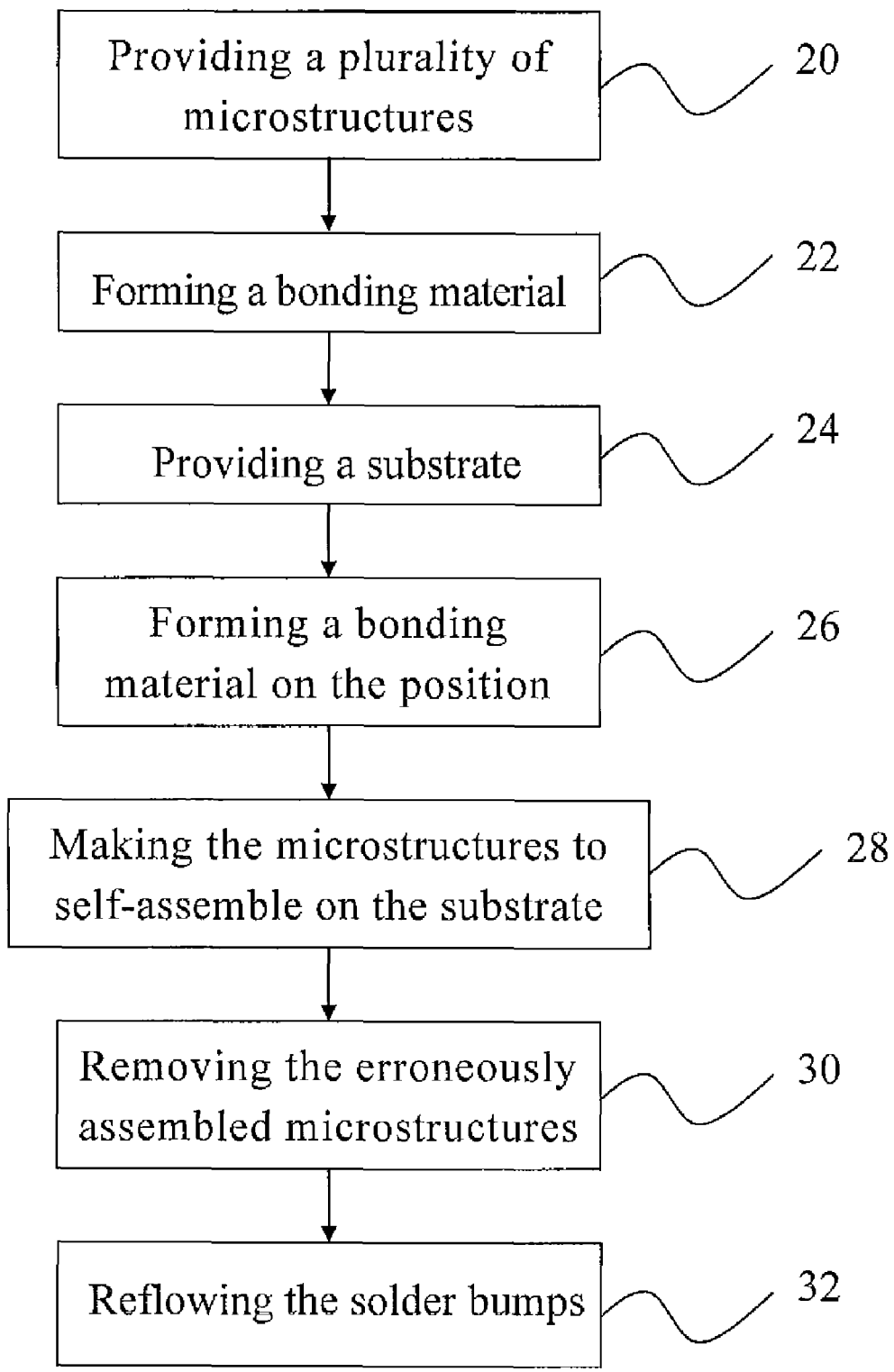
FIG. 2 is a flow chart of the method of the present invention.

With reference to FIG. 2, it is noted that the flow chart of the method of the present invention is providing a plurality of microstructures 20 and forming a bonding material 22 on the surface of the microstructures, respectively. This method is providing a substrate 24, and forming a bonding material on the position 26 for bonding these microstructures onto the substrate. The bonding material used in the present invention may be any material that is able to physically attract to each other, e.g. interface force, field force, electrostatic force, electrophoresis effect etc. However, the examples are for illustrative purpose only and do not intend to limit the scope of the invention. The interface force may be hydrophilic or hydrophobic force but is not limited to the examples. The bonding material of the present invention includes self-assembly monolayers (SAMs), 2-ethyl-1-hexanol, flux, octanol or the equivalents. The field force of the present invention includes natural magnetic objects or the electromagnetic force from the electric field but is not limited only to the examples.

The microstructures used in the present invention may include electronic elements, photoelectric elements or magnetic elements such as LEDs, RFID tags, micro-integrated circuits etc. but not limited to the examples only. The substrate in the present invention may have flexibility, and may have plane surface or non-plane surface, i.e. curved plane, cylindrical plane, columnar, network structure or the likes.

The method for forming the bonding material may include the chemical deposition, coating, printing process, imprinting technology etc. but not limited to the examples.

Next, let the microstructures to close the substrate. The attraction forces between the bonding materials on the surface of microstructures and the bonding materials on that of the substrate will make the microstructures to self-assemble on the substrate 28.

The microstructures could be previously formed on a transparent substrate by conventional technique. Therefore, a liftoff technique might be employed to separate the microstructures from the transparent substrate. The liftoff technique may include laser liftoff or heating liftoff but is not limited to the example above. When the laser liftoff is employed, the transparent substrate is reversed to allow the microstructures to face downward. Then the laser is adjusted to penetrate the backside of the transparent substrate to cleave the material into gas and metal between the transparent substrate and the microstructures. Thereafter, the microstructures are off the substrate surface and fall due to gravity. On the other hand, when the heating liftoff is employed, the microstructures might be attached to the substrate by using an adhesive tape, such that after the transparent substrate is heated, the bonding material on the adhesive tape is melted and thus the microstructures are off the substrate surface. The process that the microstructures are removed from the substrate surface is similar to the conventional pick-and-place device used to make the chips apart the wafer.

Then, a disturbance is introduced to remove the erroneously assembled microstructures 30. The disturbance will cause the originally erroneously assembled microstructures to be away from the substrate surface and then the bonding material on each of the microstructures and the substrate surface will attract to each other to realign the microstructures on the substrate. Repeating the above operation until the microstructures are assembled on the substrate correctly. The disturbance used in the present invention may include supersonic vibration, shaking by hand or machine but not limit to the examples.

Eventually, reflowing the solder bumps 32 between the microstructures and the substrate so as to self-align the microstructures onto the substrate. Besides, it allows the microstructures to be permanently fixed on and electrically connected to the substrate. The solder bump used in the present invention may include tin, lead, gold, copper, aluminum, nickel, indium or alloy of the same, but not limit to the examples above. The solder bumps are employed on top of the substrate in any appropriate method known to persons skilled in the art.

Figure 3:
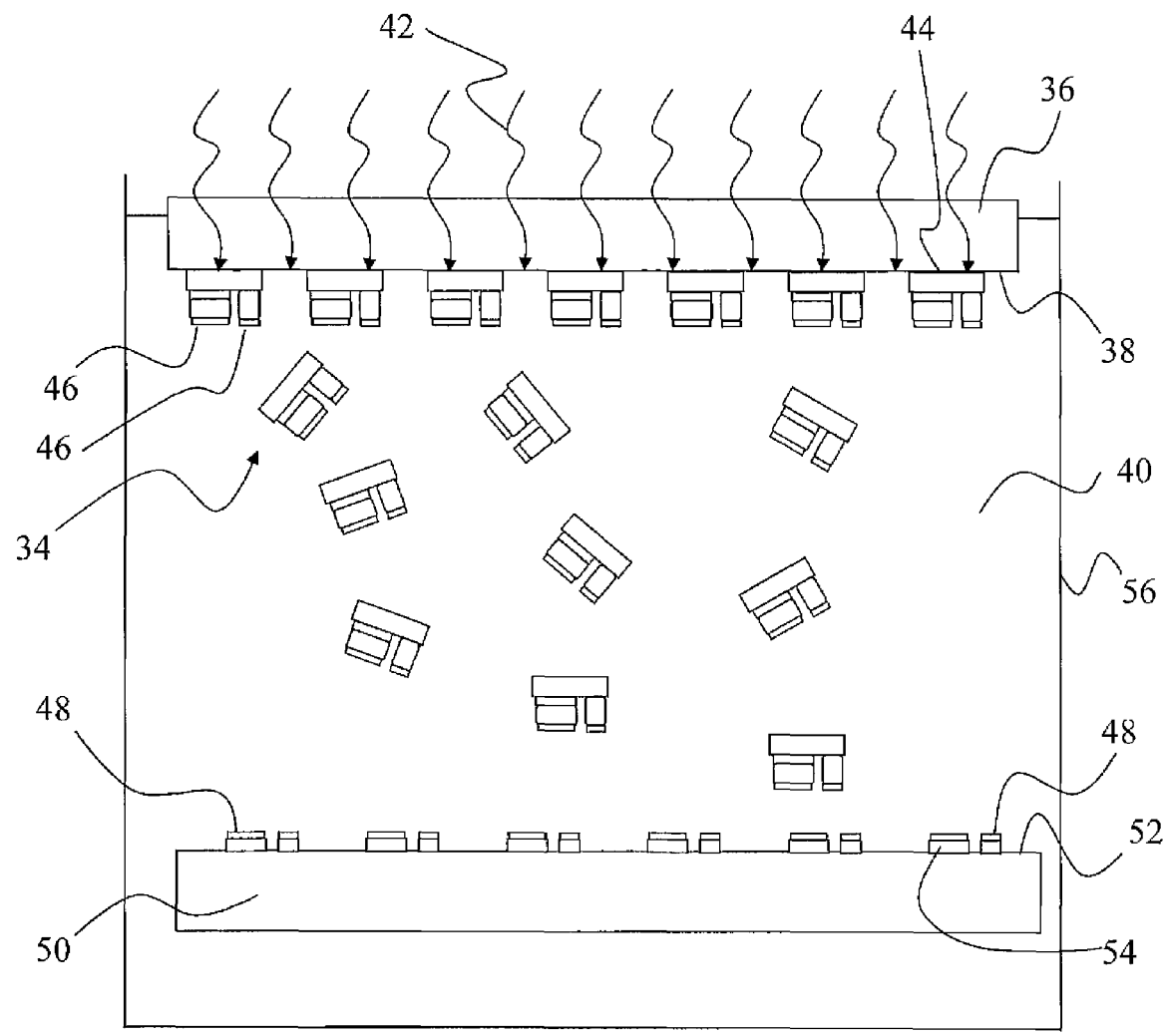
FIG. 3 is a schematic view showing that microstructures are self-assembled onto a substrate.

With reference to FIG. 3, a transparent substrate 36 having thereon microstructures 34 is up-side-down to allow a front side 38 of the transparent substrate 36 to be immersed in a liquid medium 40 received in a container 56, wherein a free side of each microstructures 34 is formed with a first bonding material 46. A substrate 50 is also immersed in the liquid medium 40 to be opposite to that of the transparent substrate 36 and a front face 52 thereof is facing upward and has multiple solder pads 54 which correspond to the microstructures 34 and respectively have a second bonding material 48. The first bonding material 46 and the second bonding material 48 are not soluble in the liquid medium 40.

A laser beam 42 is directly projected through the transparent substrate 36 so that the material in the contact region 44 in-between the transparent substrate 36 and the microstructures 34 is cleaved into gas and metal (not shown). While generating gas, the volume of the material in the contact region 44 is expanded such that the microstructures 34 are peeled off from the transparent substrate 36 and fell into the liquid medium 40. Thereafter, the first bonding material 46 on the microstructures 34 and the second bonding material 48 on the substrate 50 attract to each other so as to assemble the microstructures 34 on predetermined locations on the substrate 50. For example, if both the first bonding material 46 and the second bonding material 48 are hydrophobic materials, the microstructures 34 will be temporarily assembled on the corresponded solder pads 54 on the front face 52 of the substrate 50 by the hydrophobic attraction force between the first bonding material 46 and the second bonding material 48.

During the above self-assembling process, some of the microstructures 34 may not be properly assembled on the predetermined positions on the substrate 50 that induce the system to maintain at a higher energy state. The higher energy state was an unstable state due to the nature matters trend toward the lowest energy state. Thus a properly disturbance caused by supersonic vibration, hand shaking or machine shaking is introduced to separate the microstructures 34 (that are not properly assembled on the substrate 50) from the substrate 50. After the disturbance is stopped, the mutual attraction between the first bonding material 46 and the second bonding material 48 will re-assemble, and properly allocate the microstructures 34 on the substrate 50. Repeating above bonding-separate process several times will induce the most microstructures 34 properly aligned on the predetermined positions on the substrate 50. At this time, the system of the microstructures 34 and the substrate 50 could maintain at the lowest energy state. Thus, the microstructures 34 could temporarily bond onto the substrate 50.

Figure 4:
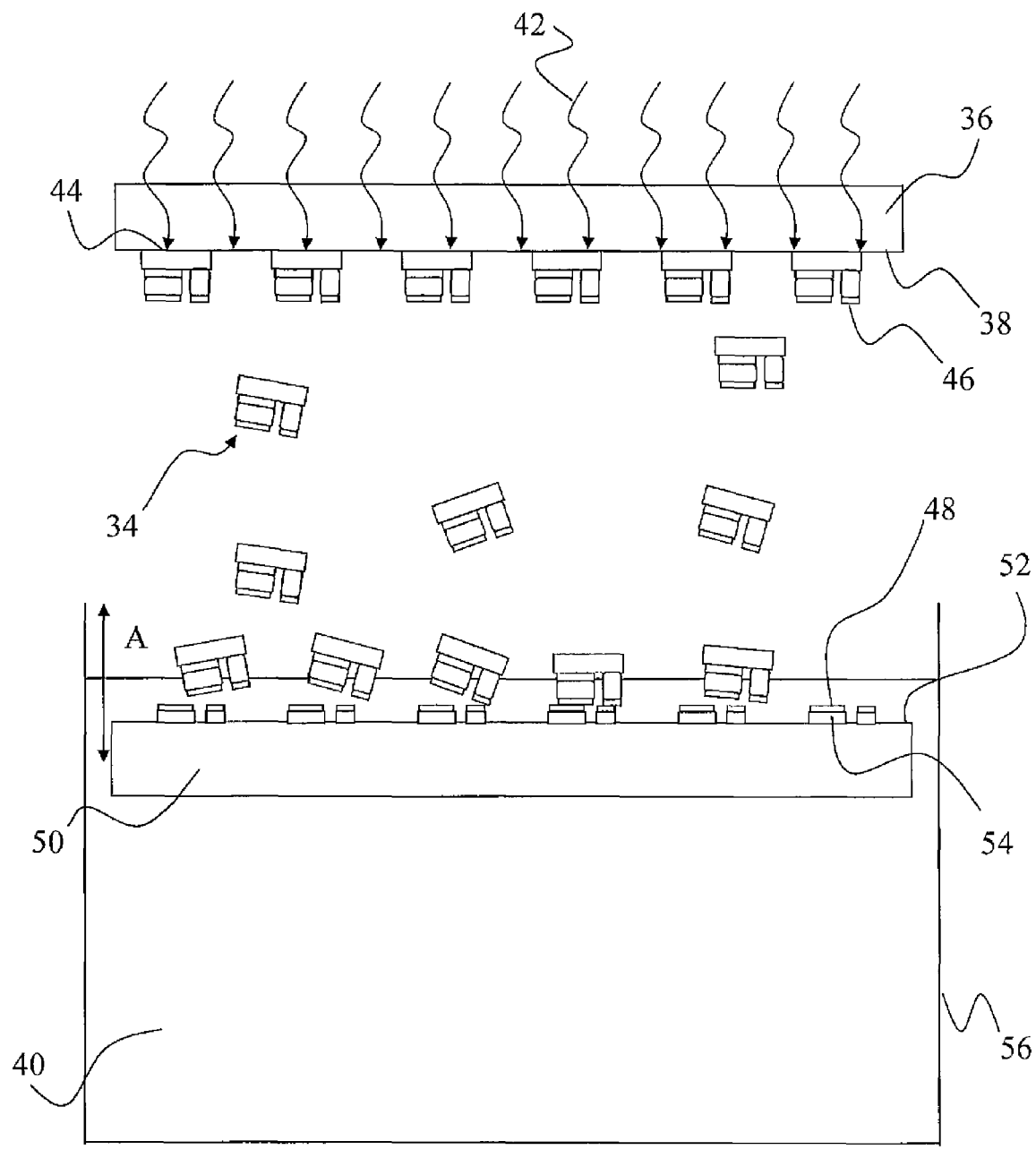
FIG. 4 is a different embodiment of the method of the present invention.

With reference to FIG. 4, a transparent substrate 36 having thereon microstructures 34 is up-side-down to allow a front side 38 of the transparent substrate 36 to face down, wherein a free side of each microstructures 34 is formed with a first bonding material 46. A substrate 50 designed to assemble the microstructures 34 is immersed in the liquid medium 40 to be opposite to that of the transparent substrate 36 and a front face 52 thereof is facing upward. The transparent substrate 36 has multiple solder pads 54 which correspond to the microstructures 34 and respectively have a second bonding material 48.

A laser beam 42 is directly projected through the transparent substrate 36 so that the material in the contact region 44 in-between the transparent substrate 36 and the microstructures 34 is cleaved into gas and metal (not shown). While generating gas, the volume of the material in the contact region 44 is expanded such that the microstructures 34 are peeled off from the transparent substrate 36 and fell into the container 56 to be suspended on the liquid medium 40 by surface tension. Thereafter, moving up and down the substrate 50 (as indicated by arrow A) to allow the first bonding material 46 on the microstructures 34 and the second bonding material 48 on the substrate 50 to attract to each other so as to assemble the microstructures 34 on predetermined locations on the substrate 50. For example, if both the first bonding material 46 and the second bonding material 48 are hydrophobic materials, the microstructures 34 will be temporarily assembled on the corresponded solder pads 54 on the front face 52 on the substrate 50 by the hydrophobic attraction force between the first bonding material 46 and the second bonding material 48.

During the above self-assembling process as indicated in FIG. 3, some of the microstructures 34 may not be properly assembled on the predetermined positions on the substrate 50 that induce the system to maintain at a higher energy state. The higher energy state was an unstable state due to the nature matters trend toward the lowest energy state. Thus a disturbance caused by supersonic vibration, hand shaking or machine shaking is introduced to separate the microstructures 34 (that are not properly assembled on the substrate 50) from the substrate 50. After the disturbance is stopped, the mutual attraction between the first bonding material 46 and the second bonding material 48 will re-assemble, and properly allocate the microstructures 34 on the substrate 50. Repeating above bonding-separate process several times will induce the most microstructures 34 properly assembled on the predetermined positions on the substrate 50. At this time, the system could maintain at the lowest energy state. Thus, the microstructures 34 could temporarily bond onto the substrate 50.

Figure 5:
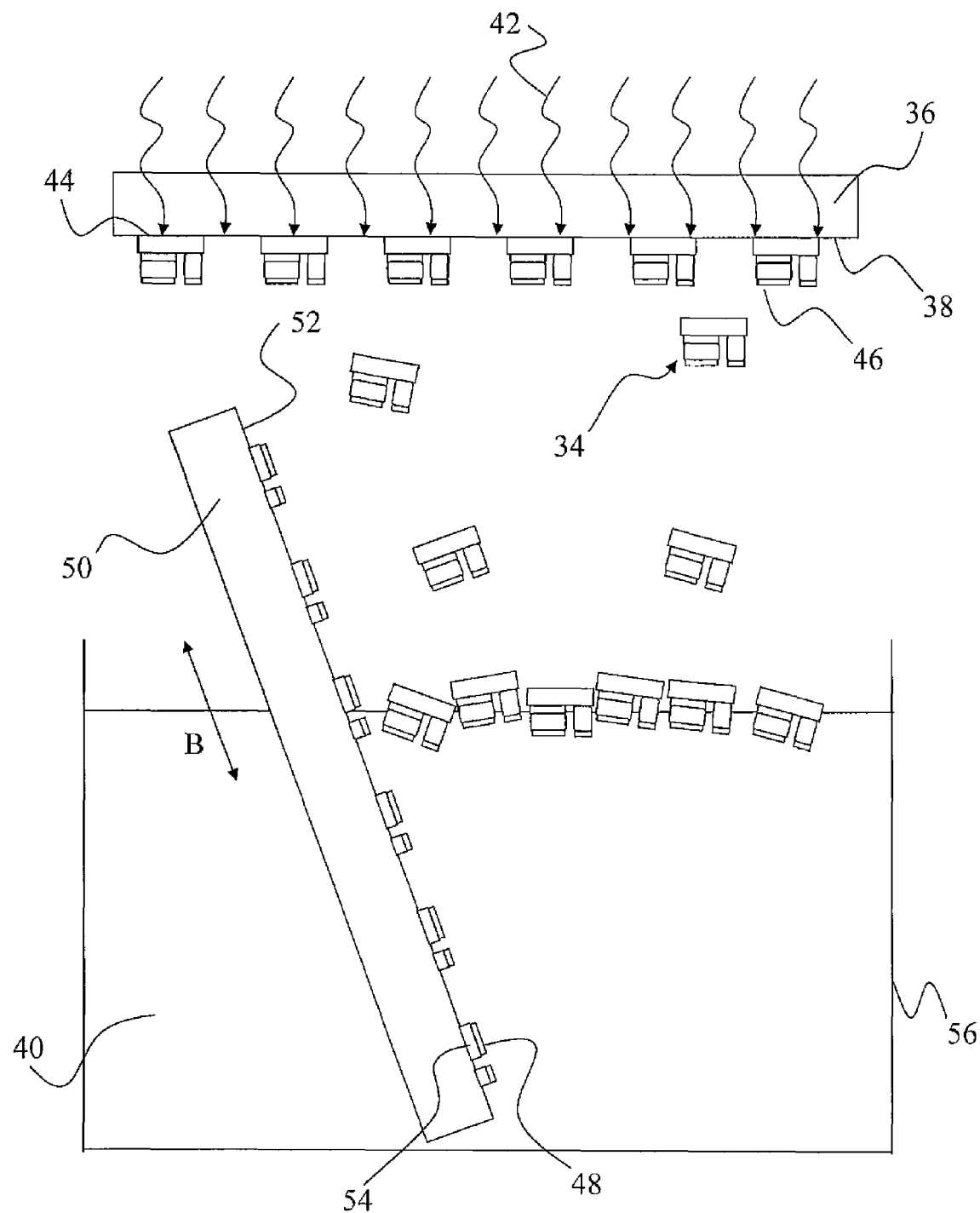
FIG. 5 is still a different embodiment of the method of the present invention.

With reference to FIG. 5, a transparent substrate 36 having thereon microstructures 34 is up-side-down to allow a front side 38 of the transparent substrate 36 to face down and one region of the substrate 50 is immersed in the liquid medium 40 and the other region of the substrate 50 is exposed above the liquid medium 40.

As the method shown in FIG. 4, a laser beam 42 is directly projected through the transparent substrate 36 so that the material in the contact region 44 in-between the transparent substrate 36 and the microstructures 34 is cleaved into gas and metal (not shown). While generating gas, the volume of the material in the contact region 44 is expanded such that the microstructures 34 are peeled off from the substrate 36 and fell into the container 56 to be suspended on the liquid medium 40 by surface tension. Thereafter, moving up and down the substrate 50 (as indicated by arrow B) to allow the first bonding material 46 on the microstructures 34 and the second bonding material 48 on the substrate 50 to attract to each other so as to assemble the microstructures 34 on predetermined locations on the substrate 50. For example, if both the first bonding material 46 and the second bonding material 48 are hydrophobic materials, the microstructures 34 will be temporarily assembled on the corresponded solder pads 54 on the front face 52 on the substrate 50 by the hydrophobic attraction force between the first bonding material 46 and the second bonding material 48.

During the above self-assembling process as indicated in FIG. 3, some of the microstructures 34 may not be properly assembled on the predetermined positions on the substrate 50 that induce the system to maintain at a higher energy state. The higher energy state was an unstable state due to the nature matters trend toward the lowest energy state. Thus a disturbance caused by supersonic vibration, hand shaking or machine shaking is introduced to separate the microstructures 34 (that are not properly assembled on the substrate 50) from the substrate 50. After the disturbance is stopped, the mutual attraction between the first bonding material 46 and the second bonding material 48 will re-assemble, and properly allocate the microstructures 34 on the substrate 50. Repeating above bonding-separate process several times will induce the most microstructures 34 properly assembled on the predetermined positions on the substrate 50. At this time, the system could maintain at the lowest energy state. Thus, the microstructures 34 could temporarily bond onto the substrate 50.

Figure 6A:
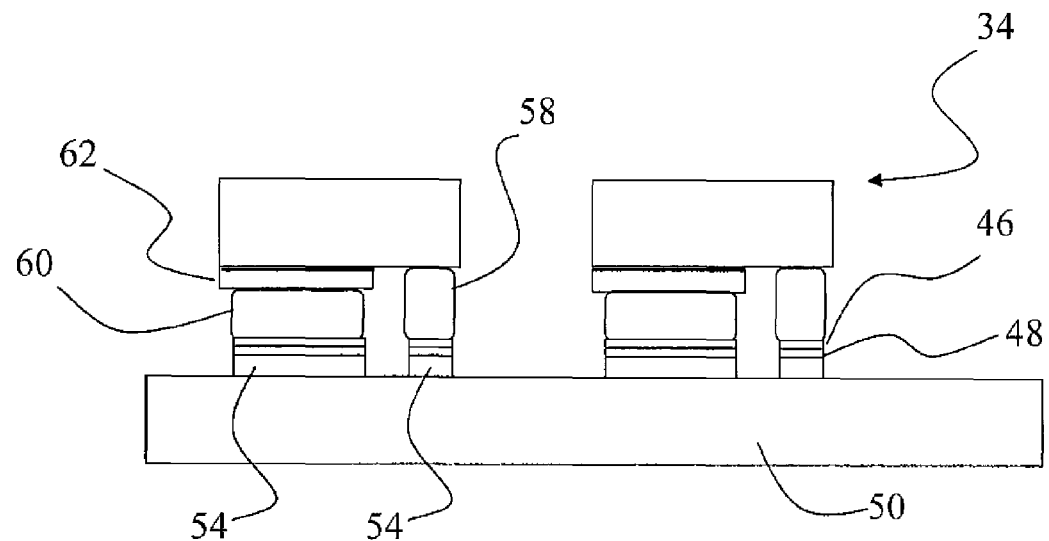
FIG. 6A is a schematic view showing that the microstructures are temporarily adhered to a substrate.
Figure 6B:
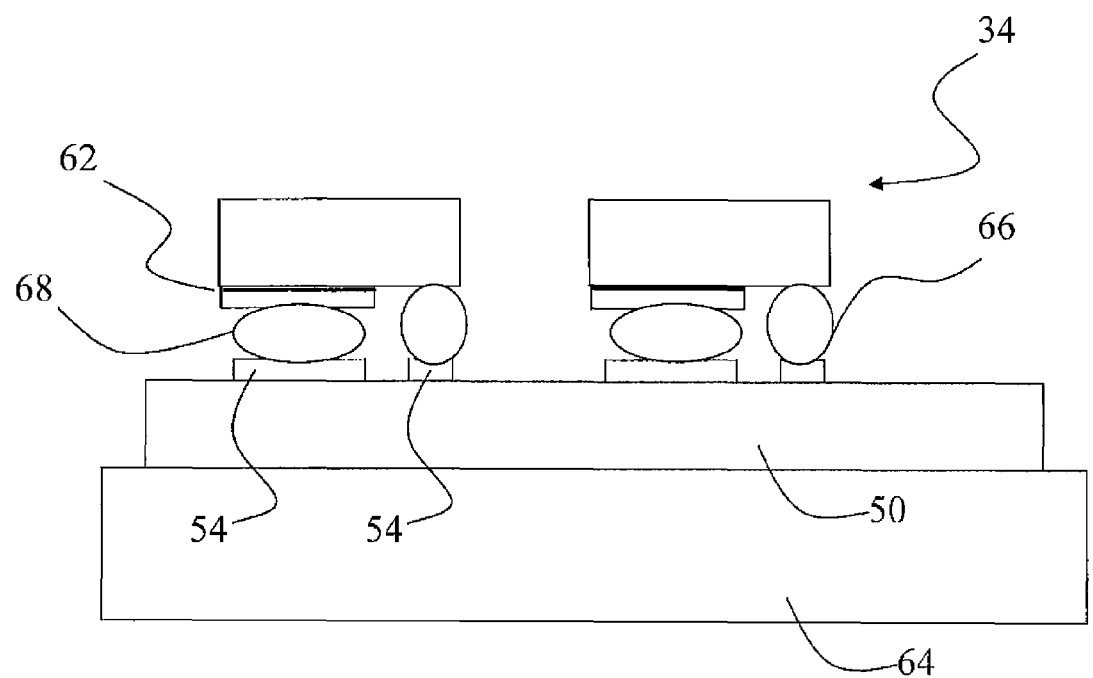
FIG. 6B is a schematic view showing that the microstructures are permanently adhered to the substrate.

After the microstructures 34 are temporarily assembled on the substrate 50, we take out the substrate 50. Wherein the solder bumps 58, 60 which are pre-located on solder pads 62 of the microstructures 34 are sandwiched between the microstructures 34 and the substrate 50, and connected to the corresponding solder pads 54 on the substrate 50 via connection between the first bonding material 46 and the second bonding material 48, as shown in FIG. 6A. With reference to FIG. 6B, then reflow by a heater 64 to heat the solder bumps 58, 60 to form solder balls 66, 68 respectively. In this step, the microstructures 34 and the substrate 50 are allowed to self-align again to form a permanent connection and electrical connection to complete the entire self-assembly process. Wherein the melting point of the solder bumps 58, 60 should be higher than that of the first bonding material 46 and the second bonding material 48 so that the first bonding material 46 and the second bonding material 48 are vaporized first during the reflow process and thus removed without affecting the reflow process of the solder bumps 58, 60.

By the design of the array pattern of the solder bumps 58, 60, it can further make accurately position of the microstructures 34 on the substrate 50 and have the night electrical connections. When the microstructures 34 are composed of two different configurations, there must be at least two solder bumps 58, 60 formed on each of the microstructures 34 to be able to form electrical connections. Therefore, the objective of correct assembly and alignment of the microstructures 34 on the substrate 50 can be achieved with the design of the two different solder bumps 58, 60 respectively having a configuration different to the other.

Figure 7:
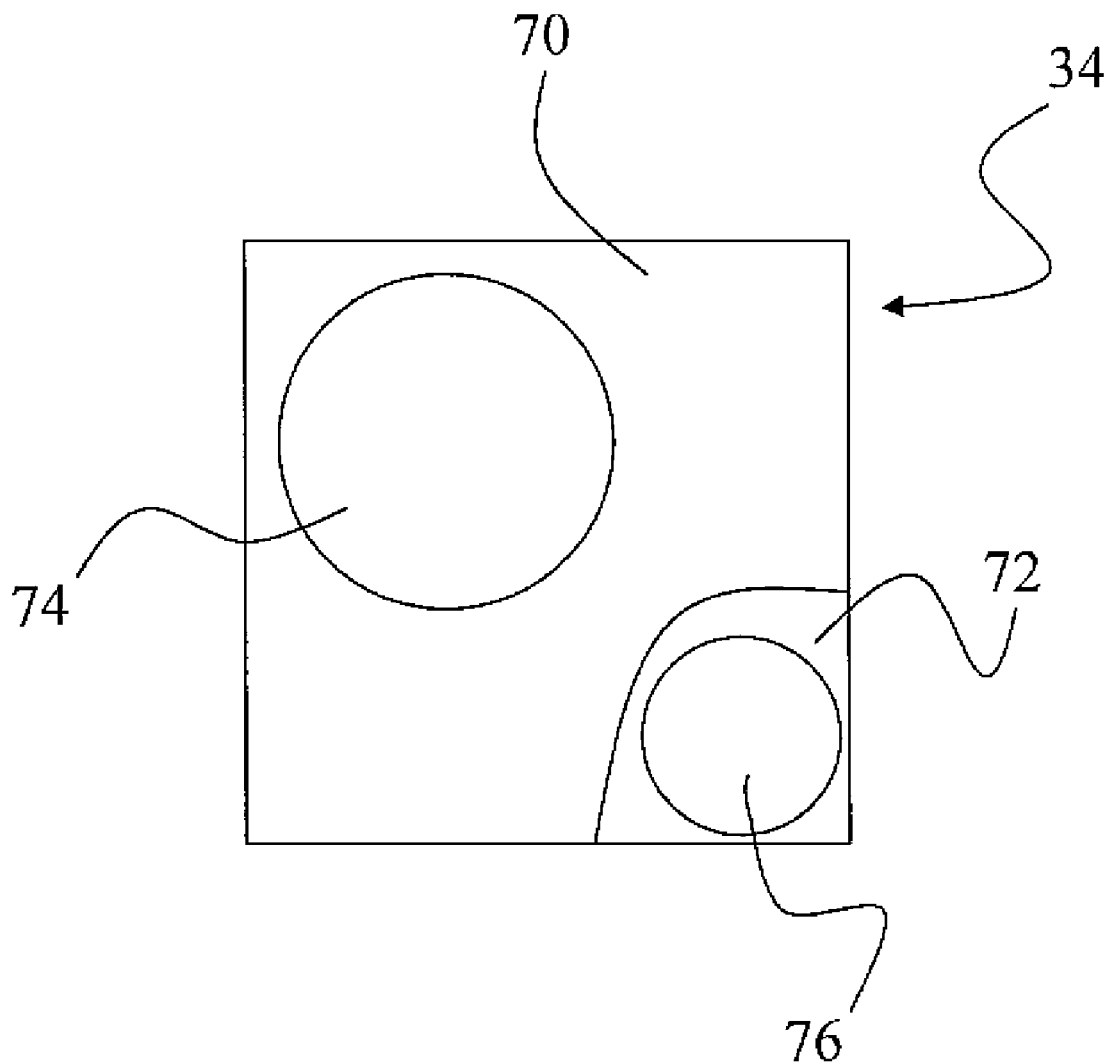
FIG. 7 is a schematic view showing the design of the microstructure having two solder bumps.

With reference to FIG. 7, which is a schematic view showing the design of the microstructure having two solder bumps. For example, if the first solder bump 74 on a first light emitting semiconductor epitaxial layer 70 has to be connected to a positive pole of a power source and the second solder bump 76 on a second light emitting semiconductor epitaxial layer 72 has to be connected to a negative pole. When the first solder bump 74 and the second solder bump 76 are designed to have the same dimension, the connections to the positive pole and the negative pole may not be correct. Therefore, if the first solder bump 74 has a dimension larger than that of the second solder bump 76. Similarly, the corresponding solder pads on the substrate is designed to be larger for the positive pole and smaller for the negative pole, then there is two different amount of bonding force and this is a asymmetry alignment. In case there is a misalignment, it will be at a higher energy status and can be self-assembled again to achieve correct assembly by adding a disturbance as mentioned above.

Figure 8:
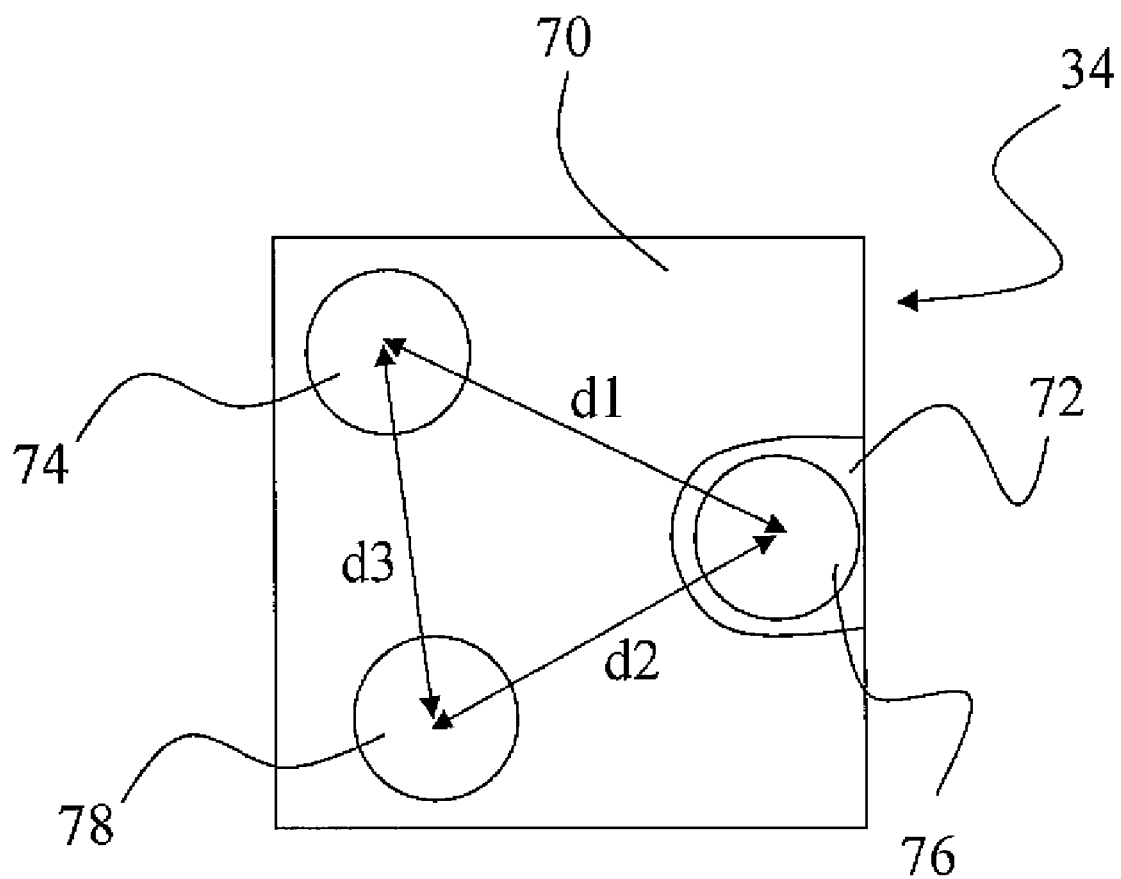
FIG. 8 is a schematic view showing the design of the microstructure having three solder bumps.

With reference to FIG. 8, which is a schematic view showing the design of the microstructure having three solder bumps. For example, if the first solder bump 74 and the third solder bump 78 on a first light emitting semiconductor epitaxial layer 70 has to be connected to a positive pole of a power source and the second solder bump 76 on a second light emitting semiconductor epitaxial layer 72 is to be connected to a negative pole, when the first solder bump 74, the third solder bump 78 and the second solder bump 76 are designed to have the same dimension and a distance therebetween is the same, the alignment may not be correct. Therefore, if each solder bump 74, 76 and 78 is designed to have the different dimension respectively or the distance therebetween d1, d2 and d3 is designed to be different respectively and the corresponding solder pads on the substrate are positioned with the same way, then there is three different amount of bonding force and this is a asymmetry alignment. In case there is a misalignment, it will be at a higher energy status and can be self-assembled again to achieve correct assembly by adding a disturbance as mentioned above.

Figure 9:
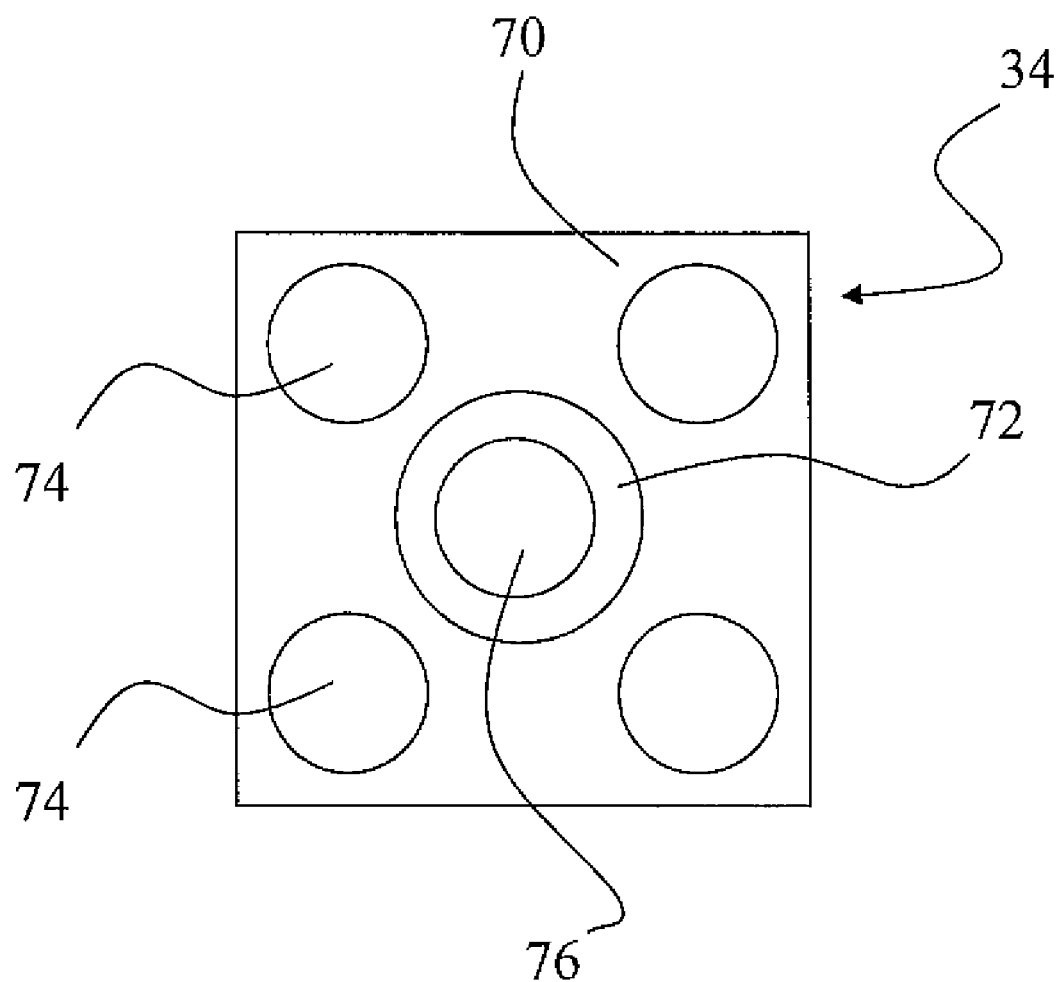
FIG. 9 is a schematic view showing the design of the microstructure having five solder bumps.

With reference to FIG. 9, which is a schematic view showing the design of the microstructure having five solder bumps. For example, if the first four solder bumps 74 on a first light emitting semiconductor epitaxial layer 70 has to be connected to a positive pole of a power source and the second one solder bump 76 on a second light emitting semiconductor chip layer 72 has to be connected to a negative pole, the second solder bump 76 can be designed to be located at the center of the microstructure 34 and the first four solder bump 74 can be designed to surround the second solder bump 76 to form symmetry array pattern, and the corresponding solder pads on the substrate are positioned with the same way. Thus no matter how the small component is rotated, the assembly could be correct aligned. In case there is a misalignment, it can be self-assembled again to achieve correct assembly by adding a disturbance as mentioned above.

Figure 10:
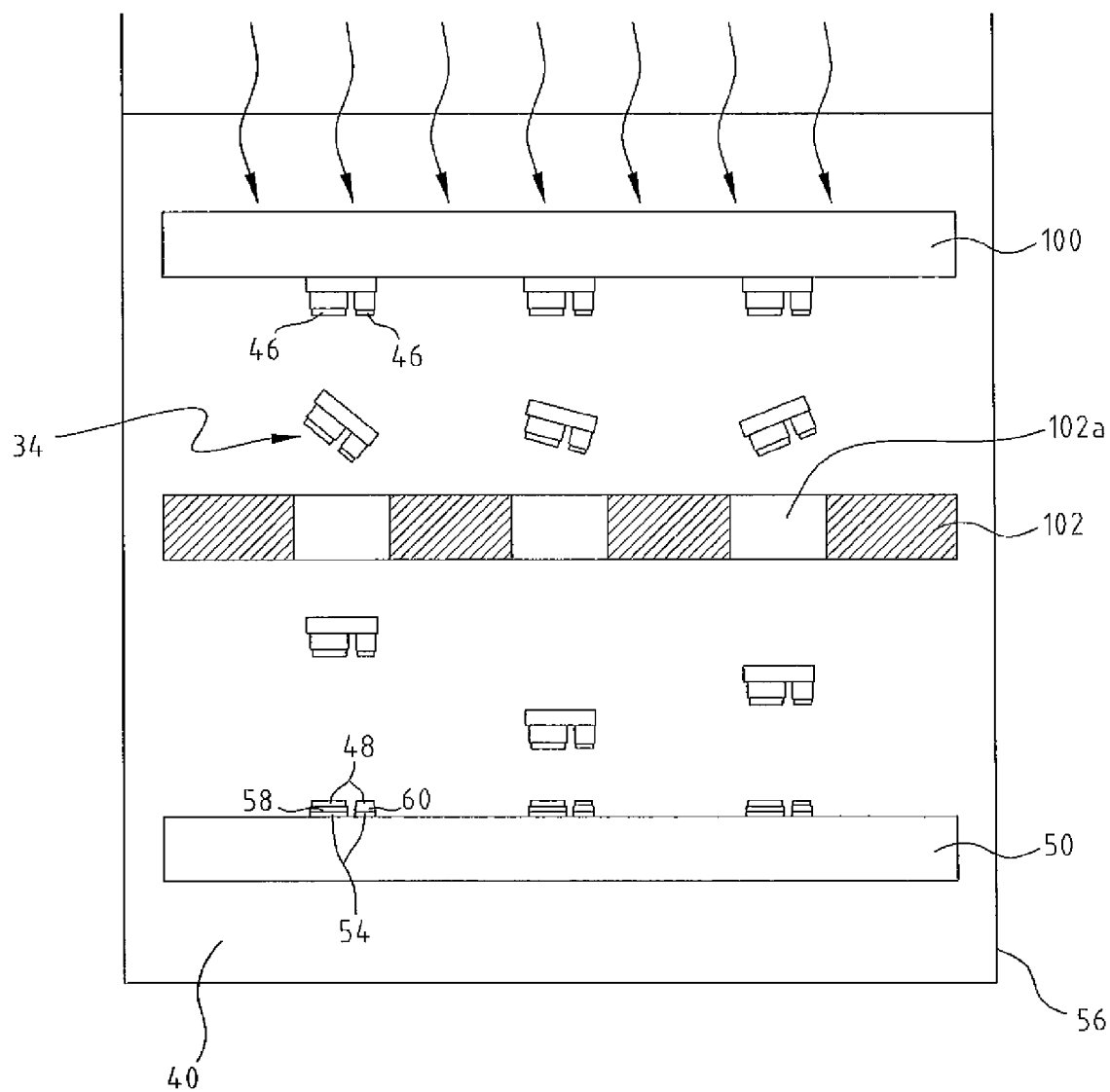
FIG. 10 is a different embodiment of the method of the present invention.
Figure 11:
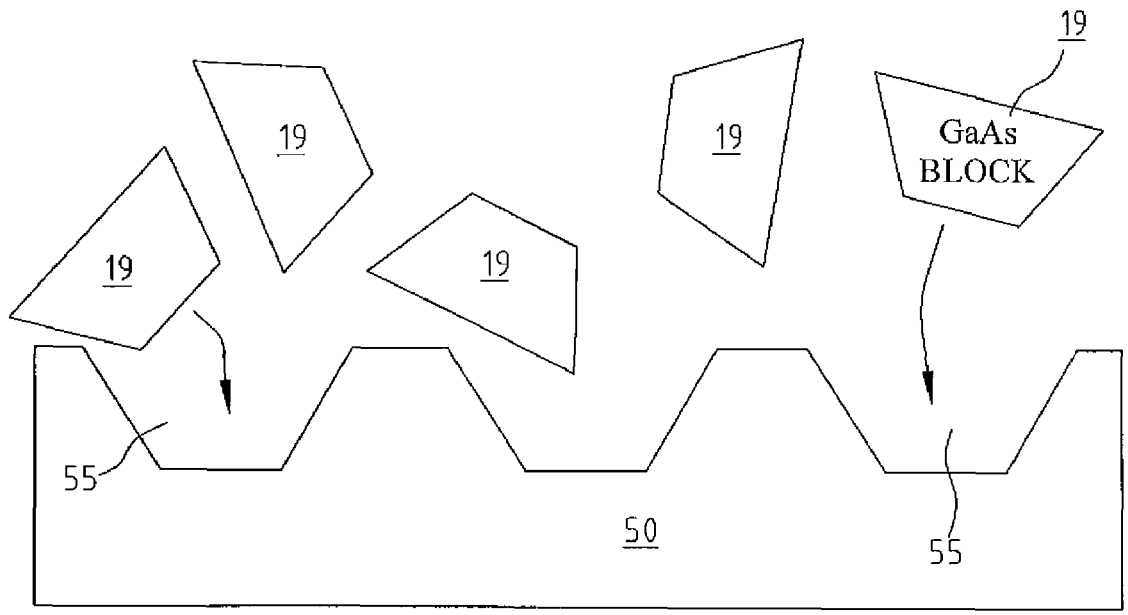
FIG. 11 is a schematic view showing the microstructures assembly of another conventional method.

With reference to FIG. 10, a substrate 50 formed with a second bonding material 48 is immersed in the liquid medium 40. Then a plate 102 is immersed in the liquid medium 40, and the plate 102 has a plurality of throughholes 102a corresponding to the solder pads 54 on the substrate. Then, a release device 100 to which the microstructures 34 is attached is also immersed in a liquid medium 40 (such as water) received in a container 56, wherein the free side of each microstructure 34 is formed with a first bonding material 46 facing toward the substrate 50. The first bonding material 46 is formed on the solder pads of the microstructures. The substrate 50 has a plurality of solder pads 54 which correspond to the microstructures 34 and each of solder pads 54 has the solder bumps 58, 60 with the liquid second bonding material 48 formed thereon. The first bonding material 46 and the liquid second bonding material 48 are not soluble in the liquid medium 40. In this embodiment, the release device 100 has a self adhesive foaming tape evenly adhered thereon. The microstructures 34 (such as the chips cut from the wafer by dicing saw) are attached to the openings formed on the release device 100, and the bonding face of each of the microstructures 34 faces toward the substrate 50. The plate 102 is placed between the release device 100 and the substrate 50, and the plate 102 has a plurality of throughholes 102a, and the size of the throughholes 102a is larger than the size of the microstructures. The release device 100 and the substrate 50 are placed closely to each other so that when the microstructures 34 fall through the throughholes 102a of the plate 102 and onto the substrate 50, they can relatively accurately locate on the liquid second bonding material 48 on the solder bumps formed on the solder pads 54.

The heat or the UV light is then directly supplied to the self adhesive foaming tape adhered on the release device 100 and thereby the stickiness of the self adhesive foaming tape is completely removed so that the microstructures 34, which are attached to the self adhesive foaming tape, simultaneously fall down and through the throughholes 102a of the plate 102 and onto the substrate 50, and assembling the microstructures to the substrate 50 by a physical attraction force induced between the first bonding material 46 and the liquid second bonding material 48 in the liquid medium 40. For example, if both the first bonding material 46 and the second bonding material 48 are hydrophobic materials, and the second bonding material 48 is, for example, a liquid organic compound, the microstructures 34 will be temporarily assembled on the corresponding solder pads 54 on the the substrate 50 by the hydrophobic attraction force between the first bonding material 46 and the second bonding material 48.

After the microstructures 34 are temporarily assembled on the substrate 50, we take out the substrate 50. Wherein the solder bumps 58, 60 which are pre-located on solder pads 54 of the substrate 50 are sandwiched between the microstructures 34 and the substrate 50, and connected to the corresponding solder pads 54 on the substrate 50 via connection between the first bonding material 46 and the second bonding material 48, as shown in FIG. 6A. With reference to FIG. 6B, then reflow by a heater 64 to heat the solder bumps 58, 60 to form solder balls 66, 68 respectively. In this step, the microstructures 34 and the substrate 50 are allowed to self-align again to form a permanent connection and electrical connection to complete the entire self-assembly process.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for self-assembling microstructure onto a substrate comprising the steps of:
   (a) providing a plurality of microstructures, each of which comprises a contact region on which a first solder pad is formed and a first bonding material supported on a solder bump formed on each of the first solder pads;
   (b) attaching the microstructures to a release device with stickiness;
   (c) providing a substrate, which comprises a plurality of second solder pads corresponding to the first solder pads on the microstructures, and a liquid second bonding material supported on each of the second solder pads;
   (d) placing a plate between the release device and the substrate, the plate having a plurality of throughholes corresponding to the second solder pads on the substrate, sizes of the throughholes being larger than those of the microstructures;
   (e) removing the stickiness of the release device to allow the microstructures to fall through the throughholes of the plate and onto the substrate, and assembling the microstructures to the solder pads on the substrate by a physical attraction force induced between the first bonding material and the liquid second bonding material in liquid; and
   (f) reflowing the solder bumps in order to permanently fix the microstructures on the substrate.

2. The method as claimed in claim 1, wherein the physical attraction force between the first bonding material and the second bonding material is an interface force.

3. The method as claimed in claim 2, wherein the interface force is hydrophobic force between hydrophobic molecules.

4. The method as claimed in claim 3, wherein the first bonding material and the second bonding material are made of a hydrophobic substance.

5. The method as claimed in claim 3, wherein the second bonding material is a liquid organic compound.

6. The method as claimed in claim 4, wherein the hydrophobic substance is selected from the group consisting of self-assembly monolayer, 2-ethyl-1-hexanol, octanol and flux.

7. The method as claimed in claim 1, wherein the physical attraction force is a field force.

8. The method as claimed in claim 7, both the first bonding material and the second bonding material are made of a magnetic substance, and the first bonding material has magnetism opposite to that of the second bonding material.

9. The method as claimed in claim 1, wherein the physical attraction force is an electromagnetic force.

10. The method as claimed in claim 1, wherein the physical attraction force is an electrostatic force.

11. The method as claimed in claim 1, wherein the microstructures are selected from the group consisting of electronic elements, photoelectric elements and magnetic elements.

12. The method as claimed in claim 1, wherein the microstructures are selected from the group consisting of light emitting diodes, RFID tags and microintegrated circuits.

13. The method as claimed in claim 1, wherein the substrate has flexibility.

14. The method as claimed in claim 1, wherein the solder bump is made of a material selected from the group consisting of tin, lead, gold, copper, aluminum, nickel indium and alloy of the same.

15. The method as claimed in claim 1, wherein the solder bump has a melting point higher than that of the first bonding material and the second bonding material.

16. The method as claimed in claim 1, wherein the solder bumps formed on the microstructures are symmetrically aligned to each other.

17. The method as claimed in claim 1, wherein the solder bumps formed on the microstructures are asymmetrically aligned to each other.

18. The method as claimed in claim 1, wherein the microstructures are suspended with a medium during assembled onto the substrate by the physical attract force.

19. The method as claimed in claim 18, wherein the medium is air.

20. The method as claimed in claim 18, wherein the medium is liquid.

21. The method as claimed in claim 20, wherein the first bonding material and the second bonding material are not soluble in the liquid.

22. The method as claimed in claim 1, wherein the step of assembling the microstructures onto the substrate further comprises a step of adding a disturbance to separate the microstructures and the substrate when there are incorrectly assembled situations.

23. The method as claimed in claim 22, wherein the disturbance is caused by a supersonic vibration.

24. The method as claimed in claim 22, wherein the disturbance is caused by a hand shaking.

25. The method as claimed in claim 22, wherein the disturbance is caused by a machine shaking.

26. The method as claimed in claim 1, wherein the solder includes at least one of tin, lead, gold, copper, aluminum, nickel, indium or an alloy thereof.

27. A method for self-assembling microstructure onto a substrate comprising the steps of:
   (a) providing a plurality of microstructures, each of which comprises a contact region on which a first solder pad is formed and a first bonding material supported on the first solder pad;
   (b) attaching the microstructures to a release device with stickiness;

(c) providing a substrate, which comprises a plurality of second solder pads corresponding to the first solder pads on the microstructures, and a liquid second bonding material supported on a solder bump formed on each of the second solder pads;

(d) placing a plate between the release device and the substrate, the plate having a plurality of throughholes corresponding to the second solder pads on the substrate, sizes of the throughholes being larger than those of the microstructures;

(e) removing the stickiness of the release device to allow the microstructures to fall through the throughholes of the plate and onto the substrate, and assembling the microstructures to the solder pads on the substrate by a physical attraction force induced between the first bonding material and the liquid second bonding material in liquid; and (f) reflowing the solder bumps in order to permanently fix the microstructures on the substrate.

28. The method as claimed in claim 27, wherein the solder includes at least one of tin, lead, gold, copper, aluminum, nickel, indium or an alloy thereof.

* * * * *